US007268610B2

(12) United States Patent
Keskin

(10) Patent No.: US 7,268,610 B2
(45) Date of Patent: Sep. 11, 2007

(54) LOW-VOLTAGE CMOS SWITCH WITH NOVEL CLOCK BOOSTING SCHEME

(75) Inventor: Mustafa Keskin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 10/986,630

(22) Filed: Nov. 12, 2004

(65) Prior Publication Data

US 2006/0049865 A1 Mar. 9, 2006

Related U.S. Application Data

(60) Provisional application No. 60/606,942, filed on Sep. 3, 2004.

(51) Int. Cl.
*H03K 17/16* (2006.01)
(52) U.S. Cl. ..................................................... 327/390
(58) Field of Classification Search ................ 327/390, 327/403, 408, 530, 534, 536
See application file for complete search history.

(56) References Cited

U.S. PATENT DOCUMENTS

| 6,380,792 | B1* | 4/2002 | Yamamoto ............... 327/390 |
| 6,404,237 | B1* | 6/2002 | Mathew et al. ............ 326/113 |
| 6,977,544 | B2* | 12/2005 | Nicollini et al. ........... 327/589 |

2004/0130383 A1 7/2004 Du et al.

FOREIGN PATENT DOCUMENTS

JP 55058776 5/1980

OTHER PUBLICATIONS

Naderi et al. "High Efficiency On-Chip CMOS DC-DC Converters For Mixed Analog-Digital Low-Power ICs," IEICE Transactions on Fundamentals of Electronics, Communications and Computer Sciences, Engineering Sciences Society, Tokyo, JP vol. E87-A, No. 2, Feb. 2004, pp. 335-343.
Palmisano et al. "Clock Boosters for 1.2-V SC Circuits," 1997 IEEE International Symposium on Circuits and Systems, Jun. 9-12, 1997, Hong Kong, vol. 3, Jun. 9, 1997, pp. 2012-2015.

* cited by examiner

*Primary Examiner*—Jeffrey Zweizig
(74) *Attorney, Agent, or Firm*—Thomas R. Rouse; Thien T. Nguyen; William M. Hooks

(57) ABSTRACT

A method and apparatus for boosting the gate voltages of a CMOS switch used in an integrated circuit designed in a sub-micron CMOS process is disclosed. The CMOS switch is coupled to Vin and Vout nodes, and contains PMOS and NMOS gates. Two boosting circuits are used to change the voltage on the PMOS and NMOS gates, respectively. The voltage at the NMOS gate is boosted from $V_{DD}$ to ($V_{DD}$+ $K \times V_{DD}$). The voltage at the PMOS gate is decreased from $V_{GND}$ to ($V_{GND} - k \times V_{GND}$). The factor k is chosen such that Vout can be sampled through the entire range of Vin=$V_{GND}$ to $V_{DD}$, even where $V_{DD}$ approaches the sum of the absolute values of the threshold voltages of the respective PMOS and NMOS transistors.

31 Claims, 6 Drawing Sheets

US 7,268,610 B2

LOW-VOLTAGE CMOS SWITCH WITH NOVEL CLOCK BOOSTING SCHEME

RELATED APPLICATIONS

This application claims priority to U.S. Provisional Application No. 60/606,942, filed Sep. 3, 2004.

BACKGROUND

1. Field

The present invention relates to semiconductor technology, and more specifically to a clock boosting scheme for Complimentary Metal-Oxide-Semiconductor (CMOS) devices.

2. Background

CMOS semiconductor fabrication technologies have advanced to the point where the transistors are becoming progressively smaller in form factor. For example, sub-micron CMOS processes are becoming mainstream for fabrication of silicon devices on many consumer electronic systems. Smaller transistor sizes provide for, among other advantages, the capability to place more functions on a single die, decreased power requirements, and increased operating frequencies of the integrated circuit device. The increased frequencies are due in part to the smaller gate capacitances associated with the sub-micron transistors as well as a lower supply voltage swing.

Power dissipation limitations of the transistors and other reliability issues generally necessitate the use of lower supply voltages for integrated circuits incorporating sub-micron CMOS processes. For instance, too high a regular supply voltage will result in higher currents and a resulting energy dissipation that will, over time, tax the delicate structures of these ultra-small transistors, and eventually result in a degradation of functionality. Consequently, circuit designers generally rely on low supply voltages (LSV) in performing analog and digital integrated circuit design for circuits using sub-micron MOS processes.

The use of LSV presents a significant benefit for the operation of digital integrated circuits due to, among other advantages, the lower power dissipation associated with using lower voltages, and the preservation of the structural integrity of the transistors. The use of LSV in connection with analog circuits designed in a sub-CMOS process, conversely, gives rise to certain challenges. One such challenge is presented, for exemplary purposes, in the context of switched-capacitor ("SC") circuits. Often one or more switches will reside on the signal path in front of a stage of sampling capacitors. A strong demand exists for a switch in various analog circuits, such as switched-capacitor circuits, which covers rail-to-rail voltage swings using LSV. Where the supply voltage is too low, the voltage on the signal path may cause the switch(es) to float or otherwise not operate properly. In such a case for certain values of the input voltage on the signal path, the floating switches may prevent the input signal from being sampled.

An example of this problem is represented in FIGS. 1 and 3. FIG. 3 depicts a basic example of a CMOS switch including NMOS transistor 300 and PMOS transistor 302. Capacitor C (304) represents a sampling capacitor at the output of the signal path Vout. An input voltage Vin is applied to the signal path at 301. Switch 306 represents an ideal sampling switch. The ideal switch is intended to demonstrate the performance of the CMOS switch, and subsequent circuits such as gain or integrator stages are ignored for the purpose of this illustration. The use of capacitor 304 and ideal switch 306 are for clarity and simplicity; the signal path may contain any number of switched capacitors or other analog components or circuits.

In many applications it is desirable for the CMOS switch to pass the signal Vin to the sampling capacitor 304 at Vout through the range where Vin goes from $V_{GND}$ to $V_{DD}$, or vice versa. That is, whatever the value of Vin, the CMOS switch (comprised of transistors 300 and 302) should be configured to allow for conduction of the signal under certain conditions. Where the power supply is very low, however, a range of amplitude of Vin may exist wherein the output of the switch cannot conduct and the signal cannot be sampled. For example, where the supply voltage $V_{DD}$ is less than the sum of the threshold voltages of NMOS transistor 300 and PMOS transistor 302—namely, $(|V_{th,p}|+V_{th,n})$—sampling of Vout cannot be achieved through the full signal swing of Vin. This situation represents a major shortcoming of CMOS analog integrated circuits using sub-micron fabrication processes, particularly in switched-capacitor and other analog applications.

FIG. 1 is a graphic illustration of the conductances of NMOS, PMOS, and CMOS switches as a function of the input voltage Vin (see FIG. 3). Plot 100 represents a graph of the conductance $g_{ds}$ of transistor 300 as a function of input voltage Vin (node 301). Plot 110 depicts a graph of the conductance $g_{ds}$ as a function of Vin. Plot 112 represents a collective graph of the resulting CMOS switch (i.e., transistors 300 and 302) as a function of Vin.

As can be seen graphically in FIG. 1 from plots 100 and 110, the magnitude of the power supply voltage $V_{DD}$ as depicted by dashed vertical line 114 in each plot is less than the sum of the threshold voltages of the two transistors $V_{th,n}$ (plot 100) and $V_{th,p}$ (plot 110). Consider the conductance of the CMOS switch as signal Vin goes from a value of $V_{GND}$ up to $V_{DD}$. Assume also, for the purpose of this illustration, that $\Phi_{nmos}=V_{DD}$ and $\Phi_{pmos}=V_{GND}$. When Vin 301 in FIG. 3 is equal to $V_{GND}$, then the gate-to-source voltage of transistor 300=$V_{DD}$>$V_{th,n}$; hence, transistor 300 is fully on and at its maximum conductance $g_{ds}$ as shown in plot 100.

As Vin in plot 100 becomes progressively larger, the gate to source voltage of NMOS transistor 300 approaches the threshold voltage $V_{th,n}$, thereby decreasing the drain current through transistor 300 and conductance $g_{ds}$. When Vin reaches a value of $V_{dd}-V_{th,n}$, then the gate-to-source voltage of transistor 300 equals the threshold voltage and the conductance $g_{ds}$ of transistor 300 reaches zero as transistor 300 turns off. Transistor 300 remains off as Vin increases to $V_{DD}$, as shown in plot 100 of FIG. 1.

Plot 110 of FIG. 1 shows the concurrent behavior of PMOS transistor 302 in the same circuit and under the same conditions. When Vin=$V_{GND}$, then transistor 302 is off. As Vin reaches the threshold value $V_{th,p}$ of PMOS transistor 302, then transistor 302 begins to turn on, a drain current flows through transistor 302, and the conductance $g_{ds}$ of transistor 302 begins to increase. The conductance $g_{ds}$ of transistor 302 reaches its maximum value when Vin=$V_{DD}$, because the gate to source voltage of the PMOS transistor 302 is at its maximum.

Plot 112 of FIG. 1 represents the collective behavior of the CMOS switch in FIG. 3. Plot 112 is a superimposition of plots 100 and 110. From the illustration of plot 112, the problems associated with using LSV in analog circuit design become evident. In particular, a region of operation exists (represented by vertical dashed lines 115 and 116) wherein the CMOS switch is off, and the Vin signal cannot be sampled at the output. The region where the circuit is inoperative in this illustration can be quantified as the region between the lower bound $V_{in}=V_{DD}-V_{th,n}$ (line 115) and the upper bound $V_{in}=V_{th,p}$ (line 116).

It will be appreciated that the principles of the circuit in FIG. 3 and the behavior of the circuit as shown in FIG. 1 is illustrative in nature, as many other circuits can be constructed which recreate essentially the same problem.

Various techniques to turn on and off floating switches and enable rail-to-rail sampling in analog circuits using LSV have been proposed in the literature. One such technique is to boost the gate voltages of the switching transistors to $2 \times V_{DD}$. Another technique is to boost the gate voltages to $V_{DD}+V_{in}$. Using the former technique, only one boosting circuit is needed to feed the various analog circuits. A major disadvantage of the former technique, however, is that the resistance of the switch varies widely as a function of the gate-to-source voltage. More specifically, $V_{GS}=2V_{DD}-V_{in}$; therefore, the output resistance of the transistor becomes dependant on Vin. Another disadvantage of using the former technique is the reliability issues that will result given that twice the power supply ($2 \times V_{DD}$) is applied to the gates of the transistors, likely causing eventual breakdown of the sub-micron transistor structures. In addition, the high gate voltage may cause undesirable currents to flow as a result of forward biasing the substrate of the transistor.

Using the latter technique has consequently been preferred because a substantially constant switch resistance can be obtained. That is, using the latter technique, $V_{GS}=(V_{DD}+V_{in})-V_{in}=V_{DD}$. One major disadvantage of the latter scheme is that a boosting circuit is required for each floating switch on the analog portion of the integrated circuit chip. Such a technique would require a substantial increase in both total power consumption and the area of the die as numerous boosting circuits would have to be designed onto the chip.

Accordingly, a demand in the art exists for a reliable switching mechanism in LSV analog circuit applications like switched capacitor circuits that has the capability to cover rail-to-rail (e.g., power to ground) voltage swings using low supply voltages, while not causing unacceptable substrate or other leakage, not unduly increasing circuit complexity, and not introducing reliability problems.

SUMMARY

In one aspect of the present invention, a circuit for boosting the supply voltages of a CMOS switch for use in an integrated circuit designed using a sub-micron process, the circuit using voltage sources of $V_{DD}$ and $V_{GND}$, includes a CMOS switch including a PMOS transistor coupled to a NMOS transistor, the CMOS switch including a PMOS gate, a NMOS gate, an input Vin and an output Vout, a first boosting circuit coupled to the NMOS gate, the boosting circuit configured to use capacitor ratios and clocking signals to boost the voltage at the NMOS gate by the quantity $(V_{DD}+k \times V_{DD})$, and a second boosting circuit coupled to the PMOS gate, the boosting circuit configured to use capacitor ratios and clocking signals to reduce the voltage at the PMOS gate by the quantity $(V_{GND}-k \times V_{DD})$, wherein k represents a factor chosen to allow sampling at Vout for values of Vin from $V_{GND}$ to $V_{DD}$.

In yet another aspect of the present invention, a circuit for boosting the supply voltages of a CMOS switch for use in an integrated circuit designed using a sub-micron process, the circuit using voltage source of $V_{DD}$ and $V_{GND}$, includes a signal path including an input and an output, a CMOS switch coupled to the signal path between the input and the output, a boosting circuit coupled to a gate of the CMOS switch, the boosting circuit including a plurality of capacitors and transistors, the ratio of the plurality of capacitors configured to boost the voltage at the gate to a value sufficient to allow sampling of the output for values of the input between $V_{GND}$ and $V_{DD}$.

In still another aspect of the present invention, a boosting circuit used in integrated circuits designed in sub-micron CMOS technology, the boosting circuit including an output, a node, three gate inputs, and the integrated circuit using a power source of $V_{DD}$ and $V_{GND}$, includes a first PMOS transistor coupled to $V_{DD}$, the output, and a first input of the three gate inputs, a first NMOS transistor coupled to $V_{GND}$, the output, and a second of the three gate inputs, a first capacitor coupled to the output and to $V_{GND}$, a second capacitor coupled to the output and to the node, a second PMOS transistor coupled to the node, $V_{DD}$, and a second of the three gate inputs, and a second NMOS transistor coupled to the node, $V_{GND}$, and the second of the three gate inputs.

In yet another aspect of the present invention, a method for boosting gate voltages of a CMOS switch, the CMOS switch coupled to a signal path comprising Vin and Vout and including a PMOS gate and a NMOS gate, the CMOS switch using power sources of $V_{DD}$ and $V_{GND}$ and part of an integrated circuit designed in sub-micron CMOS technology, includes boosting a voltage value at the NMOS gate from $V_{DD}$ to a value of $V_{DD}+(k \times V_{DD})$, and decreasing a voltage value at the PMOS gate from $V_{GND}$ to a value of $V_{GND}-(k \times V_{GND})$; wherein k is chosen to enable sampling at Vout over the range of Vin from $V_{GND}$ to $V_{DD}$.

In a further aspect of the present invention, a boosting circuit for boosting the voltages at the gates of a CMOS switch includes a signal path, CMOS switching means in the signal path for providing a Vin node and a Vout node, the CMOS switching means including NMOS and PMOS gates, NMOS boosting means for boosting a first voltage at the NMOS gate from $V_{DD}$ to a value of $V_{DD}+(V_{DD} \times k)$, PMOS boosting means for decreasing a second voltage at the PMOS gate from $V_{GND}$ to a value of $V_{GND}-(k \times V_{DD})$, and sampling means at the Vout node for sampling the Vin signal over the range from $V_{GND}$ to $V_{DD}$.

It is understood that other embodiments of the present invention will become readily apparent to those skilled in the art from the following detailed description, wherein it is shown and described only several embodiments of the invention by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings, wherein.

DETAILED DESCRIPTION

The detailed description set forth below in connection with the appended drawings is intended as a description of various embodiments of the present invention and is not intended to represent the only embodiments in which the present invention may be practiced. Each embodiment described in this disclosure is provided merely as an example or illustration of the present invention, and should not necessarily be construed as preferred or advantageous over other embodiments. The detailed description includes specific details for the purpose of providing a thorough understanding of the present invention. However, it will be apparent to those skilled in the art that the present invention may be practiced without these specific details. In some instances, well-known structures and devices are shown in block diagram form in order to avoid obscuring the concepts of the present invention. Acronyms and other descriptive terminology may be used merely for convenience and clarity and are not intended to limit the scope of the invention.

A new clock boosting scheme is introduced herein which circumscribes the shortcomings of prior art techniques and which may be combined with regular CMOS transmission gates in analog circuits. The scheme may be applied to a variety of analog NMOS, PMOS, or CMOS integrated circuits. According to the principles of the present invention, the voltage at the gates of NMOS transistors is increased by a magnitude sufficient to enable a MOS switch to operate properly using LSV. Similarly, the voltage at the gates of PMOS transistors is decreased by a magnitude sufficient to enable the MOS switch to operate properly using LSV. These boosted voltages may be low enough, however, to avoid injecting a forward bias into a junction diode and to avoid the introduction of reliability issues traditionally associated with high gate voltages on sub-micron transistors.

In one embodiment, the gate voltage of a NMOS transistor is maintained between the values $V_{DD}$ and $(V_{DD}+V_{DD}/2)$. Similarly, the gate voltage of a corresponding PMOS transistor is maintained between the values $V_{GND}$ and $(V_{GND}-V_{DD}/2)$. The boosting of gate voltages in this manner permits for sampling of an input signal through a full signal swing (e.g., from $V_{GND}$ to $V_{DD}$) even for supply voltages that are less than the quantity $|V_{th,p}|+V_{th,n}|$.

Figure 3:
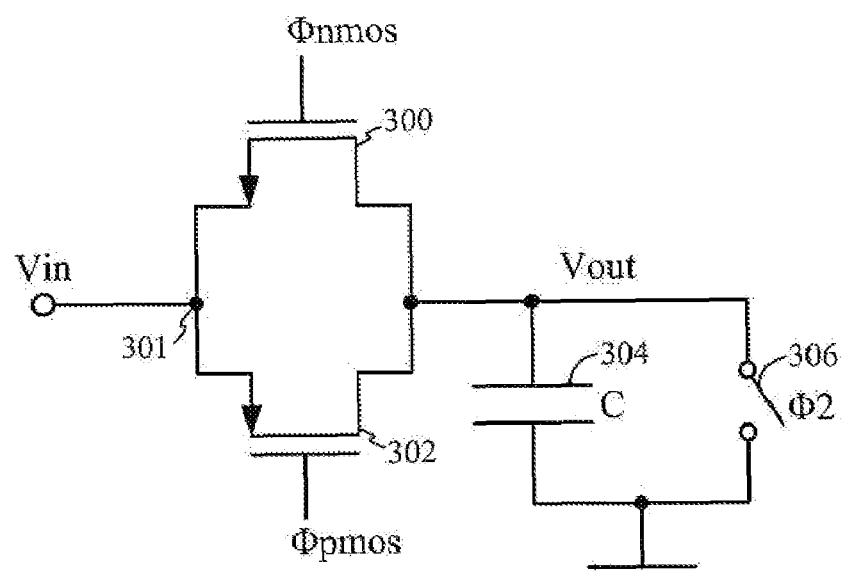
FIG. 3 is an analog CMOS transistor circuit including a CMOS switch, ideal switch, and sampling capacitor.

In the illustrative configuration, the circuit in FIG. 3 represents the CMOS switch to which the concepts of the present invention will be applied. Specifically, the value of $\Phi_{NMOS}$ is boosted in one embodiment using the boosting circuit of FIG. 4. Likewise, the value of $\Phi_{PMOS}$ is decreased using the boosting circuit of FIG. 5. FIG. 6 represents graphs of the inputs to the boosting circuits in accordance with an embodiment of the present invention.

Figure 2:
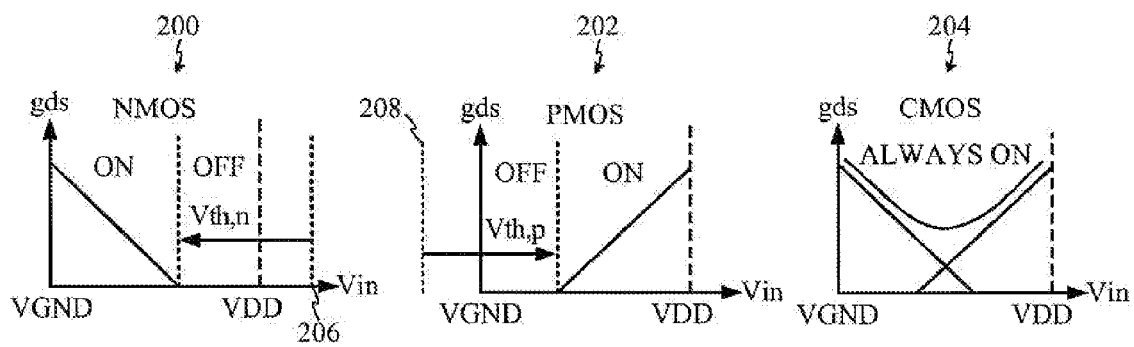
FIG. 2 is a graphic illustration of the conductances of NMOS, PMOS, and CMOS switches as a function of the input voltage Vin in accordance with an embodiment of the present invention.
Figure 4:
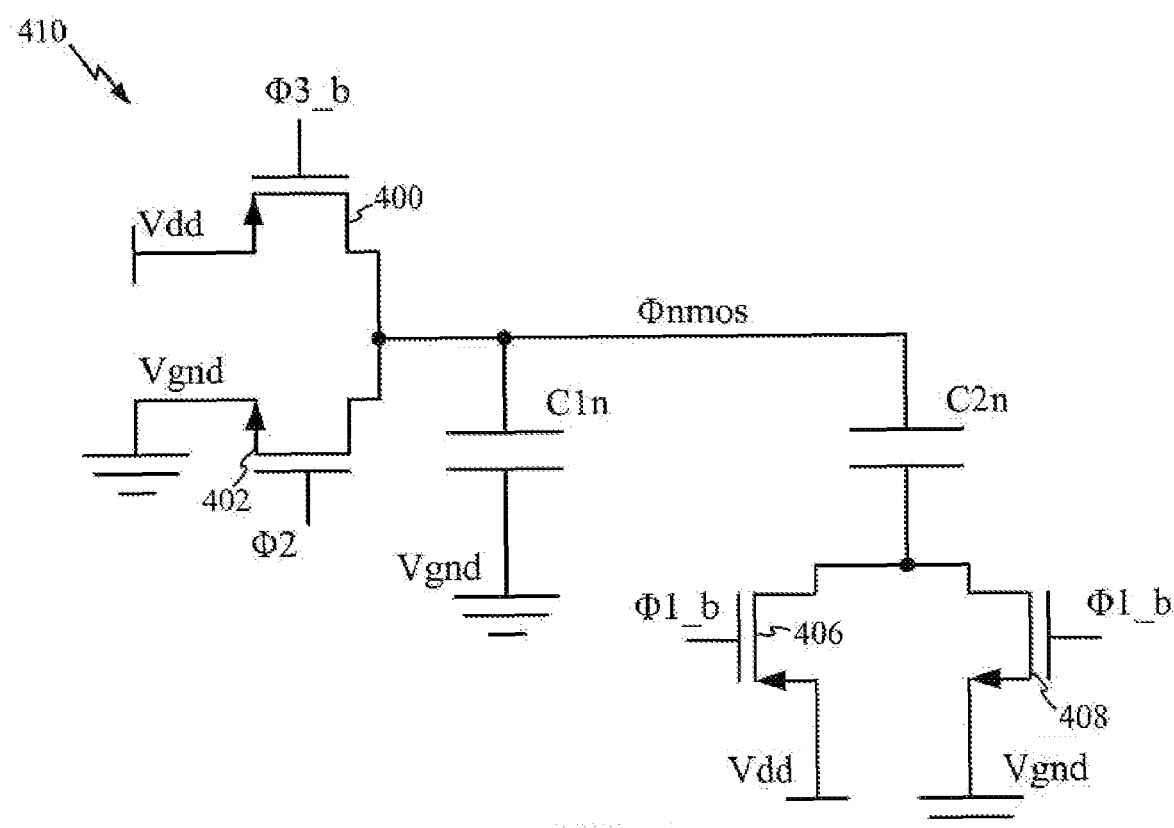
FIG. 4 is a boosting circuit for a NMOS transistor used in a LSV environment in accordance with an embodiment of the present invention.
Figure 5:
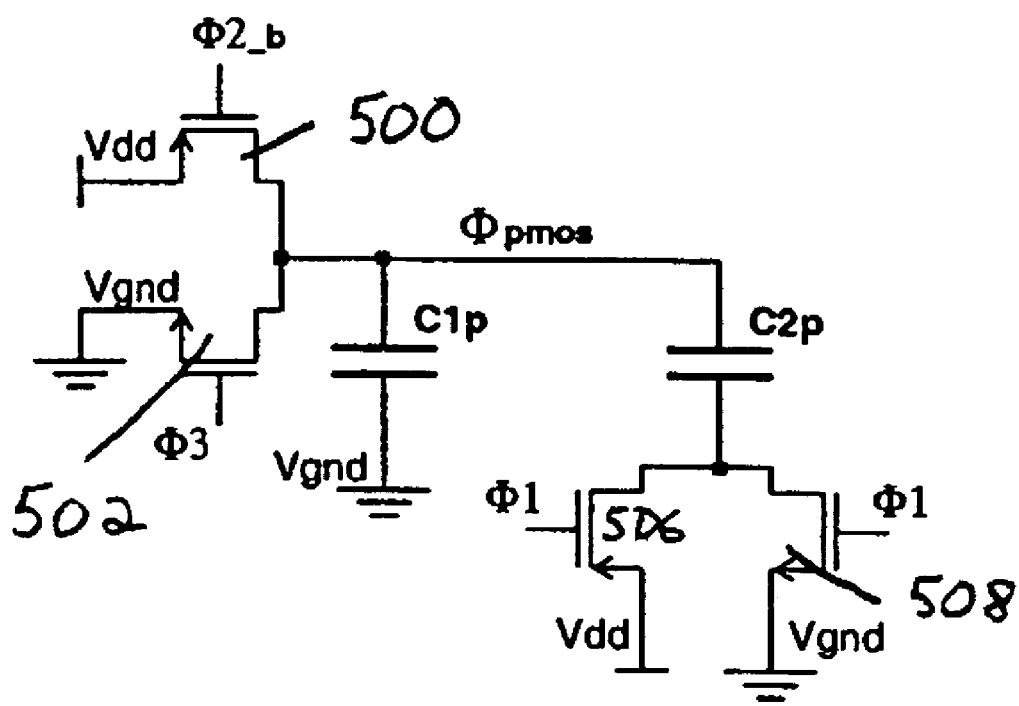
FIG. 5 is a boosting circuit for a PMOS transistor used in a LSV environment in accordance with an embodiment of the present invention.
Figure 6:
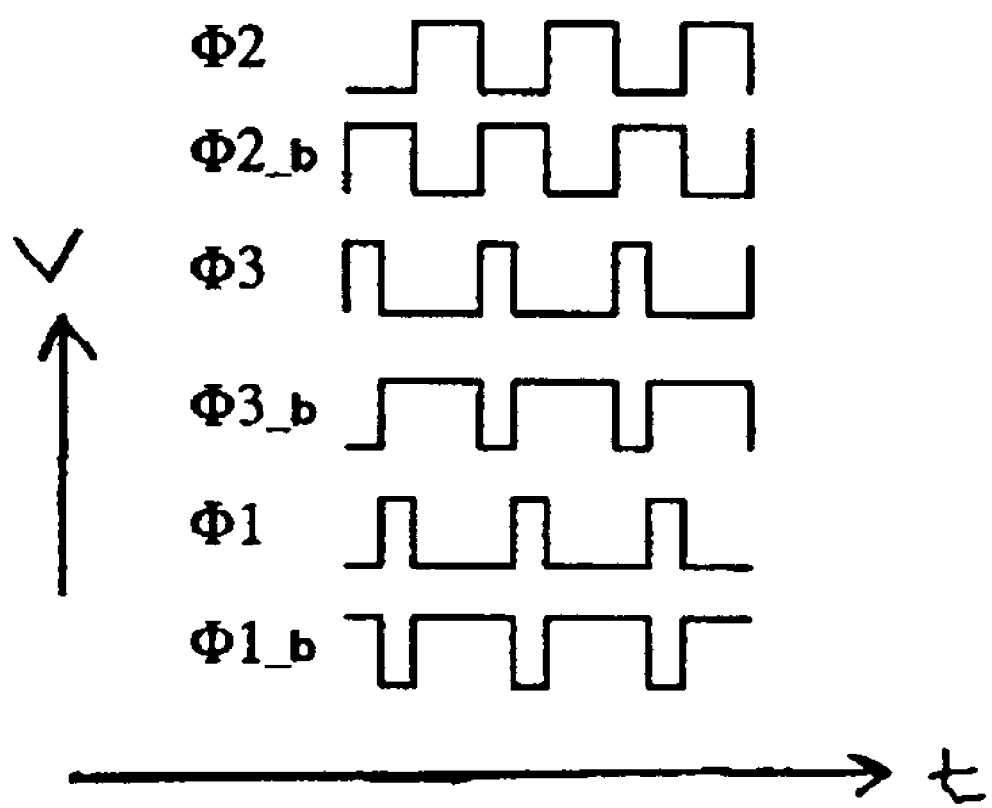
FIG. 6 is a set of timing diagrams illustrating the inputs to the boosting circuits of FIGS. 4 and 5 in accordance with an embodiment of the present invention.

Prior to describing embodiments of the boosting circuits in FIGS. 4 and 5, we illustrate in FIG. 2 the advantages associated with application of the boosting technique of the present invention. Note that, while in some instances in this specification we assume $V_{GND}=0$, this assumption is made for simplicity and clarity as $V_{GND}$ may be another value.

Figure 1:
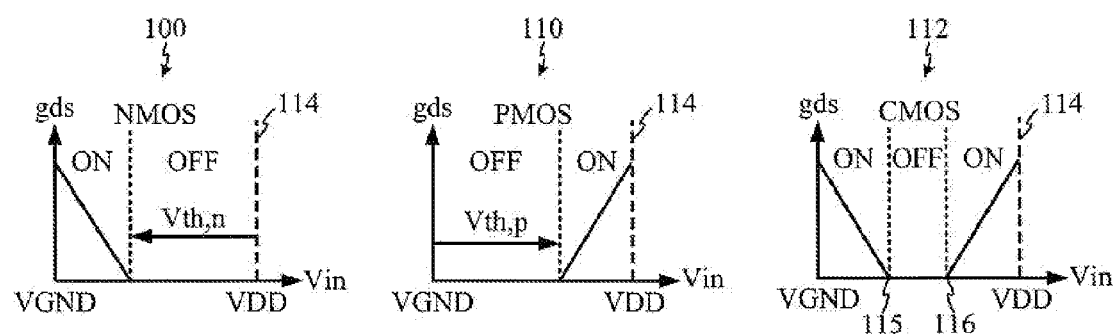
FIG. 1 is a graphic illustration of the conductances of NMOS, PMOS, and CMOS switches as a function of the input voltage Vin.

Plot 200 shows a graph of the conductance of NMOS switch 300 as a function of the input voltage Vin (301). Unlike the plot of the switch's behavior as represented in FIG. 1, the gate $\Phi_{NMOS}$ of the NMOS switch here has been increased to a value of $V_{DD}+(k \times V_{DD})$. The factor k may be chosen based on the particular process in light of the requirements posed by reliability issues. The conductance of switch 300 is at its maximum when Vin=$V_{GND}$. However, unlike in plot 100 of FIG. 1, the conductance of switch 300 remains positive from a value of Vin=$V_{GND}$ to Vin=$V_{DD}$+$(k \times V_{DD})-V_{th,n}$. At Vin=$V_{DD}$+$(k \times V_{DD})-V_{th,n}$, NMOS transistor 300 turns off. Comparing plot 200 of FIG. 2 to plot 100 of FIG. 1, it is apparent that the boosting scheme enables the NMOS switch 300 to retain conductance for a longer period of time.

Plot 202 represents the behavior of PMOS transistor 302 when the gate voltage $\Phi_{PMOS}$ is decreased to a value of $V_{GND}-(k \times V_{DD})$. Transistor 302 starts to conduct when Vin=$V_{th,p}-(k \times V_{DD})$, and reaches a maximum value when Vin=$V_{DD}$. Comparing plot 202 of FIG. 2 to plot 110 of FIG. 1, it is apparent that the boosting scheme enables the PMOS switch 302 to begin conducting at a lower input voltage.

The superimposition of plots 200 and 202 in FIG. 2 result in plot 204, which shows the resulting conductance of the CMOS switch defined by transistors 300 and 302 (see FIG. 3) as a function of input voltage. As can be seen from plot 204, throughout the range of Vin=$V_{GND}$ to $V_{DD}$, the switch is always on. As a result, the signal Vout at capacitor 304 can be sampled using $\Phi_2$ at any value of Vin. In addition, the switches 300 and 302 can be changed to different states to close the signal path or facilitate some other desired circuit behavior. It should be understood that the boosting method according to the present invention is not limited to a switch incorporating a simple PMOS and NMOS transistor. Rather, the boosting scheme as described herein may be equally applicable to more elaborate switching mechanisms and analog circuits, while remaining within the scope of the present invention.

The boosting scheme according to the present invention may result in a substantially less complicated integrated circuit than in previous bootstrapped switches wherein each individual switch requires its own independent circuitry to function properly. The architecture proposed herein, however, may need in most cases to be designed only once for each of the clock cycles.

FIG. 4 is a boosting circuit 410 for a NMOS transistor used in a LSV environment in accordance with an embodiment of the present invention. The function of boosting circuit 410 is to boost the value of $\Phi_{NMOS}$ to a value of $V_{DD}+(k \times V_{DD})$ as previously described. The node $\Phi_{NMOS}$ in FIG. 4 may be coupled to the node $\Phi_{NMOS}$, and hence the gate, of transistor 300 in FIG. 3. The circuit of FIG. 4 includes NMOS transistors 402 and 408, PMOS transistors 400 and 406, and capacitors C1n and C2n. The bottom plate of capacitor C1n is coupled to $V_{GND}$, and the bottom plate of capacitor C2n is coupled to the drain of transistor 406 and the drain of transistor 408. In addition, the source terminals of NMOS transistors 402 and 408 are coupled to $V_{GND}$, while the source terminals of PMOS transistors 400 and 406 are coupled to $V_{DD}$. The gate of transistor 400 is coupled to an input signal designated Φ3_b. The gate of transistor 402 is coupled to an input signal designated Φ2. The gates of transistors 406 and 408 are coupled to an input signal designated Φ1_b. The input signals Φ1_b, Φ2, and Φ3_b may be generated in some embodiments by standard digital logic circuits or by software as known in the art.

FIG. 5 is a boosting circuit 510 for a PMOS transistor used in a LSV environment in accordance with an embodiment of the present invention. The function of boosting circuit 510 is to decrease the value of $\Phi_{PMOS}$ from $V_{GND}$ to a value of $V_{GND}-k\times V_{DD}$) as previously described. The node $\Phi_{PMOS}$ in FIG. 5 may be coupled to the node $\Phi_{PMOS}$, and hence the gate, of transistor 302 in FIG. 3. The circuit in FIG. 5 includes NMOS transistors 502 and 508, PMOS transistors 500 and 506, and capacitors C1$p$ and C2$p$. The bottom plate of capacitor C1$p$ is coupled to $V_{GND}$, and the bottom plate of capacitor C2$p$ is coupled to the drain of transistor 506 and the drain of transistor 508. The source terminals of transistors 502 and 508 are coupled to $V_{GND}$, and the source terminals of transistors 500 and 506 are coupled to $V_{DD}$. An input signal designated Φ2_b is coupled to the gate of transistor 500. An input signal designated Φ3 is coupled to the gate of transistor 502. An input signal designated Φ1 is coupled to the gates of transistors 506 and 508. The input signals Φ1, Φ2_b and Φ3 may be generated in some embodiments by standard digital logic circuits or by software as known in the art.

Shown in FIG. 6 is a timing diagram of the states of various input signals—namely, Φ1, Φ2, Φ3, Φ1_b, Φ2_b, and Φ3_b—in accordance with an embodiment of the present invention. Each of these digital signals may be toggled from $V_{GND}$ to $V_{DD}$, and may be generated using standard digital logic techniques, by software, or other methods. The behavior of the exemplary NMOS clock boosting circuit of FIG. 4 and the exemplary PMOS clock boosting circuit of FIG. 5 will now be described in view of the input signals Φ1, Φ2, Φ3, Φ1_b, Φ2_b, and Φ3_b shown in FIG. 6.

The CMOS switch of FIG. 3 may be turned off by charging $\Phi_{NMOS}$ and $\Phi_{PMOS}$ in FIGS. 4 and 5 to $V_{GND}$ and $V_{DD}$, respectively. This is accomplished when Φ2 is active (high in this example). An active Φ2 couples $\Phi_{NMOS}$ to ground via transistor 402 as shown in FIGS. 4 and 6. Φ2_b represents the opposite of signal Φ2, such that Φ2_b is low whenever Φ2 is high. A low value of Φ2_b couples $\Phi_{PMOS}$ to $V_{DD}$. In the switched capacitor circuits shown in these embodiments, the sampling clock phase is divided by two and is designated by Φ1 and Φ3 as shown in FIG. 6. When Φ3 is active (high), the top plates of capacitors at the nodes $\Phi_{NMOS}$ and $\Phi_{PMOS}$ (FIGS. 4 and 5, respectively) are charged to $V_{DD}$ and $V_{GND}$, respectively. Note that Φ3_b is the opposite to Φ3. At the same time, the bottom plates of C2$n$ (FIG. 4) and C2$p$ (FIG. 5) are connected to $V_{GND}$ and $V_{DD}$, respectively, during Φ2 and Φ3. When Φ_b is low, the bottom plates of C2$n$ (FIG. 4) and C2$p$ (FIG. 5) are switched to $V_{DD}$ and $V_{GND}$, respectively. This latter operation will transition the voltages at $\Phi_{NMOS}$ and $\Phi_{PMOS}$ (FIGS. 4 and 5, respectively) by a factor of $$\left| V_{dd} \times \frac{C2_{n,p}}{C1_{n,p} + C2_{n,p}} \right|,$$

where C1 and C2 represent the capacitor values in FIGS. 4 and 5. Accordingly, the boosted voltage at $\Phi_{NMOS}$ (FIG. 4) will be equal to $$V_{dd} + V_{dd}\left[\frac{C2n}{C1n + C2n}\right],$$

and the boosted voltage at $\Phi_{PMOS}$ will be equal to $$V_{gnd} - V_{dd}\left[\frac{C2p}{C1p + c2p}\right]$$

(FIG. 5). Note that the ratio $$\frac{C2}{C1 + C2}$$

can be used to determine the desired value of k, and the ratio can be precisely controlled and is substantially process independent.

Other circuit techniques using different methods for creating ratios to generate the factor k may be contemplated, and are within the scope of the present invention. In any event, the factor k may be controlled to boost/decrease the applicable voltages in a manner which is small enough so as not to place excessive voltage on the gates or other terminals of the switch transistors, but large enough to allow for conduction of the input signal over the entire range of $V_{GND}$ and $V_{DD}$. In addition, while some leakage may occur through the substrate terminals of the switches connected to the gates $\Phi_{NMOS}$ and $\Phi_{PMOS}$ due in part to the boosted voltages at the respective terminals, this leakage will be small and should not affect the sampling operation. Further, this leakage may be substantially negligible when compared with the leakage that may occur by doubling the power supply voltage at the gates, as in existing methods.

Simulations using HSPICE have been performed using the circuits in FIGS. 3, 4 and 5 to determine performance over a range of variables. For the purposes of the simulations, all switches are real (i.e., implemented as MOS transistors with the associated non-ideal characteristics) with the exception of the ideal switch adjacent sampling capacitor C in FIG. 3. As noted above, the ideal switch is used in order to demonstrate the performance of the CMOS switch. The process used for the simulations is a 0.25 μm CMOS process; however, numerous other sub-micron MOS process may be contemplated by those skilled in the art.

Figure 7:
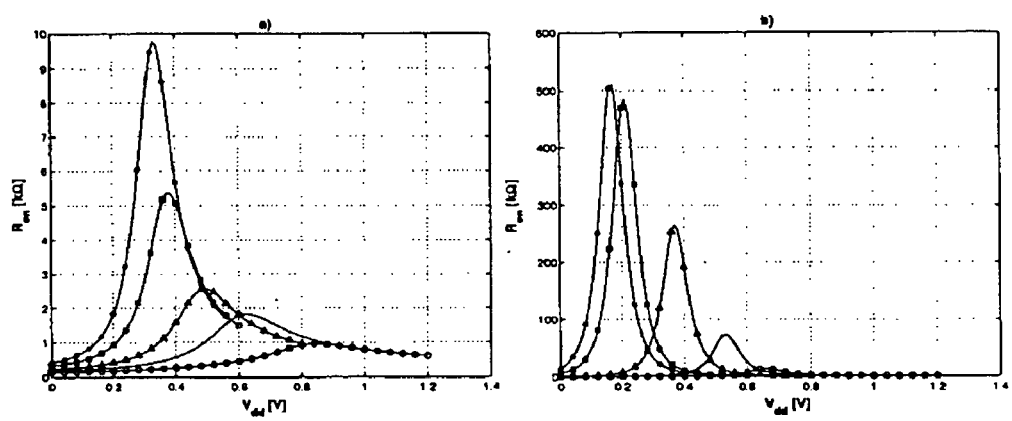
FIGS. 7a and 7b are graphical representations of the resistance $R_{ON}$ of the CMOS switch of FIG. 3 versus the input voltage Vin in accordance with an embodiment of the present invention.

FIG. 7 is a graphical representation of the resistance $R_{ON}$ of the CMOS switch of FIG. 3 versus the input voltage Vin. The simulation changes the input voltage Vin from a value of 0 to $V_{DD}$, and calculates the corresponding value of $R_{ON}$ of the CMOS switch. In FIG. 7a, the gate voltages of the CMOS switch are boosted. In FIG. 7b, the gate voltages are at the regular supply voltages. $V_{DD}$=1.2 volts (circles), 1 volt (dots), 0.8 volts (triangles), 0.6 volts (squares), and 0.55 volts (diamonds). The embodiment in FIGS. 3, 4 and 5 is shown to be functional as $V_{DD}$ is lowered from 1.2 volts down to 0.55 volts, where the absolute value of device threshold voltages (NMOS/PMOS) is approximately 0.54 volts. According to the principles of the present invention, the ratio between C1$_n$, C2$_n$, C1$_p$, and C2$_p$ may be optimized in order to obtain a relatively small value of $R_{ON}$ of the CMOS switch, which optimization will depend on the specific process utilized and the supply voltage used in connection with a particular circuit design. In the simulations shown, however, the boosted voltages do not exceed $3 \times V_{DD}/2$. The $R_{ON}$ of the CMOS switch is shown for boosted and for regular supply voltages in FIGS. 7a and 7b, respectively. In this simulated implementation, the largest $R_{ON}$ is 5.3 KΩ for boosted supply voltages, and 490 KΩ for regular voltages when $V_{DD}$ is equal to 0.6 volts. As can be readily observed from FIG. 7b, the CMOS switch using the regular supply voltage does not work in center regions of rail-to-rail voltage when $V_{DD}$ is lower than 1.1 volts. Conversely, as shown in FIG. 7a, the boosted scheme is almost perfect even where LSV approaches the threshold values of the individual devices.

Figure 8:
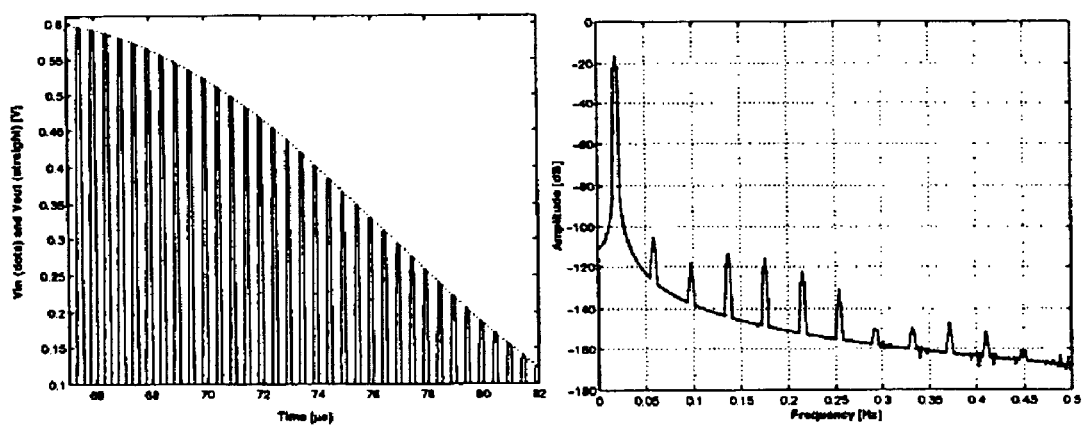
FIG. 8 is a graphical representation of the input and output waveforms in the time domain and the Fourier transform of the output signal in accordance with an embodiment of the present invention.

FIG. 8 is a graphical representation of simulation results for input and output waveforms in the time domain (left graph), and the Fourier transform of the output signal (frequency domain, right graph). In this simulation, for illustrative purposes, the clock frequency is chosen to be 2 MHz and the signal frequency is chosen to be 20 KHz. The supply voltage is 0.6 volts and a full signal swing is provided from 0 volts to 0.6 volts. C1 and C2 (FIGS. 4 and 5) are set to 100 fF and C (see FIG. 3) is set to 1 pF. The aspect ratios of the devices for the CMOS switch are set to 12/0.3 μm. The other noncritical switches are chosen to be 4/0.3 μm. Spurious-free-dynamic range is 90 dB.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A circuit for boosting the supply voltages of a CMOS switch for use in an integrated circuit designed using a sub-micron process, the circuit using voltage sources of $V_{DD}$ and $V_{GND}$, comprising:
   a CMOS switch comprising a PMOS transistor coupled to a NMOS transistor, the CMOS switch comprising a PMOS gate, a NMOS gate, an input Vin and an output Vout;
   a first boosting circuit, separate from the NMOS transistor and coupled to the NMOS gate, the first boosting circuit providing a first capacitor ratio adapted to boost the voltage at the NMOS gate by the quantity $(V_{DD}+k_1 \times V_{DD})$ in response to receiving first clocking signals, wherein $k_1$ comprises a factor determined in part by the first capacitor ratio; and
   a second boosting circuit, separate from the PMOS transistor and coupled to the PMOS gate, the second boosting circuit providing a second capacitor ratio adapted to reduce the voltage at the PMOS gate by the quantity $(V_{GND}-k_2 \times V_{DD})$ in response to receiving second clocking signals, wherein $k_2$ comprises a factor determined in part by the second capacitor ratio;
   wherein the factors $k_1$ and $k_2$ allow sampling at Vout for values of Vin from $V_{GND}$ to $V_{DD}$.

2. The circuit of claim 1 further comprising a sampling capacitor at the output Vout.

3. The circuit of claim 1 wherein each of the factors $k_1$ and $k_2$ substantially equals 0.5.

4. The circuit of claim 1 wherein each of the factors $k_1$ and $k_2$ is further chosen to avoid excessive substrate leakage.

5. The circuit of claim 1 wherein each of the factors $k_1$ and $k_2$ is further chosen to avoid excessive gate voltage values.

6. The circuit of claim 1 wherein the first boosting circuit comprises a first capacitor C1n and a second capacitor C2n forming the first capacitor ratio used in part to determine $k_1$.

7. The circuit of claim 6 wherein the second boosting circuit comprises a third capacitor C1p and a fourth capacitor C2p forming the second capacitor ratio used in part to determine $k_2$.

8. The circuit of claim 1 wherein $V_{GND}$ is substantially equal to zero volts.

9. A circuit for boosting the supply voltages of a CMOS switch for use in an integrated circuit designed using a sub-micron process, the circuit using voltage source of $V_{DD}$ and $V_{GND}$, comprising:
   a signal path comprising an input and an output;
   a CMOS switch coupled to the signal path between the input and the output;
   a boosting circuit, separate from the CMOS switch and coupled to a gate of the CMOS switch, the boosting circuit comprising a plurality of capacitors and transistors, a ratio of the plurality of capacitors is configured to boost the voltage at the gate by a factor k to a value sufficient to allow sampling of the output for values of the input between $V_{GND}$ and $V_{DD}$, wherein the factor k is determined in part by the ratio of the plurality capacitors.

10. The circuit of claim 9 wherein the gate is a NMOS gate and the boosting circuit is configured to boost the voltage at the NMOS gate from $V_{DD}$ to a value of $(V_{DD}+k \times V_{DD})$.

11. The circuit of claim 10 wherein k substantially equals 0.5.

12. The circuit of claim 9 wherein the gate is a PMOS gate and the boosting circuit is configured to decrease the voltage at the PMOS gate from $V_{GND}$ to a value of $(V_{GND}-k \times V_{DD})$.

13. The circuit of claim 12 wherein k substantially equals 0.5.

14. The circuit of claim 9 wherein the boosting circuit comprises capacitors C1 and C2, and the value of the boosted gate voltage is determined in part based on a ratio of C1 and C2.

15. The circuit of claim 9 further comprising a sampling capacitor at the output of the signal path.

16. The circuit of claim 9 wherein $V_{GND}$ is substantially equal to zero volts.

17. A boosting circuit used in integrated circuits designed in sub-micron CMOS technology, the boosting circuit comprising an output, a node, three gate inputs, and the integrated circuit using a power source of $V_{DD}$ and $V_{GND}$, comprising:
   a first PMOS transistor coupled to $V_{DD}$, the output, and a first input of the three gate inputs;
   a first NMOS transistor coupled to $V_{GND}$, the output, and a second of the three gate inputs;
   a first capacitor coupled to the output and to $V_{GND}$;
   a second capacitor coupled to the output and to the node;
   a second PMOS transistor coupled to the node, $V_{DD}$, and a second of the three gate inputs; and
   a second NMOS transistor coupled to the node, $V_{GND}$, and the second of the three gate inputs.

18. The boosting circuit of claim 17, wherein the three gate inputs are configured to boost the voltage at the output from $V_{DD}$ to a value of $V_{DD}+(k \times V_{DD})$.

19. The boosting circuit of claim 18, wherein k substantially equals 0.5.

20. The boosting circuit of claim 18, wherein the output is coupled to a NMOS gate of a CMOS switch.

21. The boosting circuit of claim 17, wherein the three gate inputs are configured to decrease the voltage at the output from $V_{GND}$ to a value of $V_{GND}-(k\times V_{DD})$.

22. The boosting circuit of claim 21, wherein k substantially equals 0.5.

23. The boosting circuit of claim 21, wherein the output is coupled to a PMOS gate of a CMOS switch.

24. The boosting circuit of claim 17, wherein the three gate inputs are controlled by digital logic.

25. The boosting circuit of claim 17, wherein $V_{GND}$ is substantially zero volts.

26. A method for boosting gate voltages of a CMOS switch, the CMOS switch coupled to a signal path comprising Vin and Vout and including a PMOS gate and a NMOS gate, the CMOS switch using power sources of $V_{DD}$ and $V_{GND}$ and part of an integrated circuit designed in sub-micron CMOS technology, the method comprising:
  boosting a voltage value at the NMOS gate from $V_{DD}$ to a value of $V_{DD}+(k_1\times V_{DD})$, wherein $k_1$ comprises a factor determined in part by a first capacitor ratio distinct from the CMOS switch; and
  decreasing a voltage value at the PMOS gate from $V_{GND}$ to a value of $V_{GND}-(k_2\times V_{GND})$, wherein $k_2$ comprises a factor determined in part by a second capacitor ratio distinct from the CMOS switch;
  wherein the factors $k_1$ and $k_2$ are chosen to enable sampling at Vout over the range of Vin from $V_{GND}$ to $V_{DD}$.

27. The method of claim 26, wherein the factors $k_1$ and $k_2$ are further chosen to minimize the boosted voltages at $V_{DD}$ and $V_{GND}$ to avoid degradation of the CMOS switch.

28. The method of claim 26 wherein $V_{GND}$ substantially equals zero volts.

29. The method of claim 26 wherein the boosting the voltage value and the decreasing the voltage value are performed by boosting circuits comprising switched capacitors.

30. The method of claim 29 wherein the value of each of the factors $k_1$ and $k_2$ is determined in part using a ratio of two capacitors.

31. A boosting circuit for boosting the voltages at the gates of a CMOS switch, comprising:
  a signal path;
  CMOS switching means in the signal path for providing a Vin node and a Vout node, the CMOS switching means including NMOS and PMOS gates;
  NMOS boosting means, separate from the CMOS switching means, for boosting a first voltage at the NMOS gate from $V_{DD}$ to a value of $V_{GND}+(V_{DD}\times k_1)$, wherein $k_1$ comprises a factor determined in part by a first capacitor ratio;
  PMOS boosting means, separate from the CMOS switching means, for decreasing a second voltage at the PMOS gate from $V_{GND}$ to a value of $V_{GND}-(k_2\times V_{DD})$, wherein $k_2$ comprises a factor determined in part by a second capacitor ratio; and
  sampling means at the Vout node for sampling the Vin signal over the range from $V_{GND}$ to $V_{DD}$ based on the factors $k_1$ and $k_2$.

* * * * *